(12) United States Patent
Terano et al.

(10) Patent No.: US 7,364,929 B2
(45) Date of Patent: Apr. 29, 2008

(54) NITRIDE SEMICONDUCTOR BASED LIGHT-EMITTING DEVICE AND MANUFACTURING METHOD THEREOF

(75) Inventors: Akihisa Terano, Hachioji (JP); Shigehisa Tanaka, Kokubunji (JP)

(73) Assignee: Opnext Japan, Inc., Yokohama-Shi (JP)

( * ) Notice: Subject to any disclaimer, the term of this patent is extended or adjusted under 35 U.S.C. 154(b) by 82 days.

(21) Appl. No.: 11/492,924

(22) Filed: Jul. 26, 2006

(65) Prior Publication Data
US 2007/0224715 A1 Sep. 27, 2007

(30) Foreign Application Priority Data
Mar. 22, 2006 (JP) .............................. 2006-078184

(51) Int. Cl.
*H01L 21/00* (2006.01)
(52) U.S. Cl. ................. 438/46; 257/615; 257/E33.023; 257/E33.025; 257/E33.028; 257/E21.085
(58) Field of Classification Search .................. 438/46; 257/615
See application file for complete search history.

(56) References Cited
U.S. PATENT DOCUMENTS

| | | | |
|---|---|---|---|
| 2002/0036286 A1* | 3/2002 | Ho et al. ...................... | 257/11 |
| 2005/0042788 A1* | 2/2005 | Ueda ............................ | 438/46 |
| 2006/0081857 A1* | 4/2006 | Hong et al. ................... | 257/84 |
| 2006/0091501 A1* | 5/2006 | Hanaoka et al. ............. | 257/615 |
| 2006/0177953 A1* | 8/2006 | Takeuchi ...................... | 438/29 |
| 2007/0063207 A1* | 3/2007 | Tanizawa et al. ............. | 257/94 |

FOREIGN PATENT DOCUMENTS

| | | |
|---|---|---|
| JP | 05-183189 | 7/1993 |
| JP | 11-145518 | 5/1999 |
| JP | 11-177134 | 7/1999 |
| JP | 11-186605 | 7/1999 |
| JP | 11-354458 | 12/1999 |
| JP | 2002-026389 | 1/2002 |
| JP | 2005-233740 | 9/2005 |

* cited by examiner

*Primary Examiner*—Trung Dang
(74) *Attorney, Agent, or Firm*—Antonelli, Terry, Stout & Kraus, LLP.

(57) ABSTRACT

An object of the present invention is to provide a nitride semiconductor based light-emitting device, which is low in operating voltage reduction and is high in performance, and a manufacturing method thereof.

A first metal film is formed on a P-type conductive nitride semiconductor formed on a substrate, and then, a film ($WO_x$) made of tungsten oxide is formed in superimposition, followed by annealing.

16 Claims, 7 Drawing Sheets

BEFORE ANNEAL

AFTER ANNEAL

WIDTH = 2mm

NITRIDE SEMICONDUCTOR BASED LIGHT-EMITTING DEVICE AND MANUFACTURING METHOD THEREOF

CLAIM OF PRIORITY

The present application claims priority from Japanese application JP 2006-078184, filed on Mar. 22, 2006, the content of which is hereby incorporated by reference into this application.

BACKGROUND OF THE INVENTION

1. Field of the Invention

The present invention relates to a method of manufacturing a nitride semiconductor based light-emitting device and a nitride semiconductor based light-emitting device manufactured by using the same.

2. Description of the Related Arts

Studies have been intensively made for implementation of a light-emitting device at parts from green to ultra-violet by the use of a semiconductor made of nitride typified by gallium nitride.

In general, a nitride semiconductor is made to grow on a substrate made of a sapphire single crystal, Si or the like by metal-organic chemical vapor deposition (abbreviated as "MOCVD") or molecular beam epitaxy (abbreviated as "MBE"). The MOCVD has been principally used in crystal growth for a light-emitting device requiring both of N- and P-type conductive semiconductor layers.

In the case where a P-type conductive nitride semiconductor is obtained by the MOCVD, Mg has been generally used as a dopant. However, it has been known that hydrogen is mixed into a crystal of the nitride semiconductor together with Mg, to thus passivate an acceptor in combination with an Mg atom in the crystal, by an influence of a hydrogen gas used as a carrier gas during growth or a hydrogen impurity produced by decomposition of ammonia ($NH_3$) as a raw material of nitrogen.

Such an influence has considerably reduced a carrier concentration of the resultant P-type nitride semiconductor with a high resistivity immediately after the growth.

As means for solving the above-described problem has been heretofore disclosed a technique for eliminating the hydrogen from the crystal so as to activate an acceptor and reducing a resistivity of a P-type nitride semiconductor by allowing an Mg doped P-type nitride semiconductor (GaN) to grow, followed by annealing at a temperature of 400° C. or higher (see Japanese Patent Application Laid-open No. 183189/1993).

Japanese Patent Application Laid-open No. 183189/1993 has disclosed a preferred embodiment, in which in reference to a graph illustrating the relationship between an annealing temperature and a resistivity rate of the Mg doped P-type GaN, the resistivity rate starts to gradually decrease at an annealing temperature of 400° C. or higher, most decreases at about 700° C., and continues to be at a low level up to 1000° C.

With the technique disclosed in Japanese Patent Application Laid-open No. 183189/1993, the annealing has needed to be performed at a temperature as high as at least 700° C. to 1000° C. in order to obtain the P-type GaN having a high carrier concentration.

However, a study made by inventors of the present application has showed that resistivity rate increases conversely if annealing is carried out at a temperature of 700° C. or higher. Therefore, there is not obtained the same effect as that produced by the technique disclosed in Japanese Patent Application Laid-open No. 183189/1993.

Otherwise, a technique has been disclosed, in which a catalyst metal such as Pt (see Japanese Patent Application Laid-open No. 186605/1999), Co (see Japanese Patent Application Laid-open No. 145518/1999), Pd (see Japanese Patent Application Laid-open Nos. 177134/1999 and 354458/1999), Ni (see Japanese Patent Application Laid-open No. 26389/2002) or the like is thinly formed on an Mg doped P-type nitride semiconductor in the same manner as described above, followed by annealing at a temperature of 200° C. or higher in gas containing oxygen or gas not containing oxygen, a hydrogen impurity is eliminated from a crystal, thereby increasing a carrier concentration.

SUMMARY OF THE INVENTION

Upon the study made by inventors of the present application, a phenomenon has been observed in which the resistivity of the P-type GaN layer seems to be reduced due to the increase in carrier concentration in the crystal even at a low annealing temperature in the above-described method using the catalyst metal in comparison with the case where no catalyst metal is used, but it has been found that the resistivity is not varied at all at a temperature as low as about 200° C., and therefore, the annealing need be performed at a temperature of at least 400° C. or higher.

A more excellent result could be attained under much preferable conditions that the annealing has been performed within a temperature range of 500° C. to 700° C. and in a gas containing oxygen, for example, in a normal atmosphere than in a gas not containing oxygen. In one example of the carrier concentration obtained after the annealing, a sample coated with Ni having a film thickness of 10 nm as a catalyst metal has been subjected to annealing at a temperature of 600° C. for 10 minutes in the atmosphere on an Mg doped P-type GaN layer (having an Mg doping concentration of $7.4 \times 10^{19}$ $cm^{-3}$ and a film thickness of 2.0 μm), which has grown on a sapphire substrate via an AlN buffer layer and an un-doped GaN layer by well-known MOCVD. Thereafter, a carrier concentration determined by Hall effect measurement using the van der Pauw was $1.2 \times 10^{17}$ $cm^{-3}$. Furthermore, it was revealed that the resistivity becomes higher at an annealing temperature higher than 700° C., like in the case of no catalyst metal.

Moreover, as a result of examination of a hydrogen concentration in the Mg doped P-type GaN layer before and after the above-described annealing by secondary ion mass spectroscopy (abbreviated as "SIMS"), it has been found that the hydrogen concentration before the annealing is $7.5 \times 10^{19}$ $cm^{-3}$ which is almost equal to the Mg doping concentration: in contrast, it has been found that the hydrogen concentration after the annealing is about $6.9 \times 10^{19}$ $cm^{-3}$ which signified a small hydrogen elimination quantity from the Mg doped P-type GaN layer.

Additionally, for the removal property of the catalyst metal after activation by the annealing, the above-described sample coated with an Ni film, as disclosed that the catalyst metal was impregnated in hydrochloric acid at room temperature, to be readily removed, was subjected to the same treatment with hydrochloric acid. As a result, it was revealed that a very thin residual is produced on the semiconductor, and thus the catalyst metal could not be completely removed only by treatment with a chemical solution. In addition, a contact resistivity ρc between the Mg doped P-type GaN layer and an ohmic electrode formed on the Mg doped P-type GaN layer was as high as $3.1 \times 10^{-1}$ Ocm$^2$ by an adverse influence of the residual or the like.

In view of the above description, since the hydrogen could not be sufficiently eliminated from the Mg doped P-type nitride semiconductor layer in the prior art, the Mg atom could not be satisfactorily activated as an acceptor, resulting in a problem of difficulty in increasing the carrier concentration.

Furthermore, the catalyst metal coated by the activation annealing also could not be completely removed only by treatment with the chemical solution such as hydrochloric acid. As a result, there is a problem of degradation of an ohmic property with the ohmic electrode.

Moreover, since most of the elements of the above-described catalyst metals have characteristics of easy achievement of the ohmic property with respect to the P-type GaN, the use as a semiconductor contact layer with the ohmic electrode was tried as it was after the annealing. However, it has been found that the elements of the catalyst metals are considerably degraded by cubical expansion due to hydrogen absorption by the annealing or an influence of oxidation, and therefore, it cannot function as the contact layer with the ohmic electrode.

The present invention has been accomplished in view of the above-described problems. An object of the present invention is to provide a manufacturing method of a nitride semiconductor based light-emitting device including at least an N-type conductive nitride semiconductor, an active layer, a P-type conductive nitride semiconductor stacked in sequence on a substrate, and an electrode formed for the purpose of achievement of an ohmic property with respect to each of the nitride semiconductors of the N- and P-types, wherein a hydrogen impurity of a high concentration mixed in the P-type nitride semiconductor is sufficiently eliminated, thereby reducing a hydrogen concentration in the P-type nitride semiconductor less than that in the prior art, so as to obtain the P-type nitride semiconductor having a low resistivity and a high carrier concentration; a nitride semiconductor based light-emitting device of a high performance provided with a P-type nitride semiconductor layer having the low resistivity and the high carrier concentration achieved by the above-described method; and a semiconductor based light emitting apparatus of a high performance having the nitride semiconductor based light-emitting device mounted thereon.

The above-described object can be achieved by a manufacturing method of a nitride semiconductor based light-emitting device comprising: an epitaxial multilayer formation process for stacking an N-type conductive nitride semiconductor layer, an active layer made of a semiconductor and a P-type conductive nitride semiconductor layer in this order on a semiconductor wafer; a metal film formation process for forming a first metal film on the P-type conductive nitride semiconductor layer; a film formation process for forming a film made of tungsten oxide on the first metal film; an annealing process for subjecting the semiconductor wafer after the film formation process to annealing; a film removing process for removing the film made of the tungsten oxide; and an electrode formation process for forming an electrode capable of achieving an ohmic contact with each of the N- and P-type conductive nitride semiconductor layers.

Furthermore, it is desirable that the thickness of the first metal film should range from 5 nm to 50 nm.

Moreover, it is preferable that the first metal film should be a single film made of at least one kind of metal selected from a group consisting of Pd (palladium), Pt (platinum), Ru (ruthenium) and Ni (nickel), or a film stack or a mixed metal made of two or more kinds of metals selected from the metal group.

In addition, it is desirable that the annealing should be performed in the atmosphere containing oxygen.

Additionally, it is desirable that the annealing should be performed within a temperature range from 300° C. or higher to 700° C. or lower.

Furthermore, it is desirable that the thickness of a film made of the tungsten oxide should fall within a range from 100 nm to 1000 nm.

Moreover, it is preferable that the film made of the tungsten oxide should be formed by at least one kind of coating method selected from a group consisting of sputtering, CVD (abbreviating "Chemical Vapor Deposition") and a method for forming a single tungsten thin film by deposition, sputtering, CVD or the like, followed by the annealing in the atmosphere containing oxygen.

There has been known that the tungsten oxide has a coloring property by adsorbing and occluding gaseous hydrogen present in the air, as typified by, for example, tungsten trioxide (WO$_3$).

Inventors of the present application disclosed, in Japanese Patent Application Laid-open No. 233740/2005, a technique relating to a hydrogen sensor for detecting the presence of hydrogen down at a low concentration area at room temperature by utilizing variations of optical characteristics based on the coloring phenomenon.

Upon a study of the above-described technique for the purpose of application to the elimination of the hydrogen present in the nitride semiconductor in a solid state, inventors of the present application found that the first metal film having a catalysis is formed in contact with the P-type nitride semiconductor, before a film made of tungsten oxide is formed on the first metal film, followed by the annealing, thereby remarkably reducing the hydrogen concentration in the nitride semiconductor more than in the prior art.

In principle, the hydrogen contained in the nitride semiconductor is drawn into an atomic state by the first metal film having the catalysis by the annealing, and then, is taken into the tungsten oxide film having a remarkably high adsorbing property with respect to a hydrogen atom.

Then, the hydrogen atom diffused in the tungsten oxide film moves to an outermost surface of the tungsten oxide film while being occluded in the tungsten oxide film. Thereafter, the hydrogen is released to the atmosphere in combination with oxygen in the atmosphere.

Since the hydrogen is repeatedly adsorbed and released to the atmosphere during the annealing, the hydrogen contained in the nitride semiconductor can be efficiently drawn down to a low concentration. This effect allows an acceptor impurity to function as an acceptor.

Consequently, it is possible to increase the carrier concentration of the P-type nitride semiconductor, so as to obtain the P-type nitride semiconductor having the resistivity lower than that in the prior art.

Although the target effect according to the present invention can be satisfactorily produced even if the thickness of the film made of the tungsten oxide is as great as 3000 nm or more, the above-described range of the film thickness is preferable since a period of time required for removing the film made of the tungsten oxide thereafter becomes longer.

In addition, the above-described first metal film may incorporate a material serving as an acceptor impurity. Even if the above-described acceptor impurity is formed in an island shape or more thinly than the first metal film between the first metal film and the film made of the tungsten oxide, the material serving as the acceptor impurity is diffused in the first metal film by the following annealing, resulting in a structure similar to that in the case where the material serving as the acceptor impurity is incorporated in the first metal film from the beginning, so as to produce the same effect.

The material serving as the acceptor impurity should be preferably at least one kind or two kinds or more selected from a group consisting of Mg (magnesium), Zn (zinc) and C (carbon). In the above-described method, a very shallowly diffused portion is sparsely formed by replacing the acceptor impurity with hydrogen present at the outermost surface of the P-type nitride semiconductor after the acceptor impurity is diffused in a direction of the P-type nitride semiconductor by the following annealing. Thus the carrier concentration is falsely increased at the outermost surface of the semiconductor, thereby enhancing the ohmic property with respect to an electrode, which is formed thereafter.

Additionally, a second metal film may be stacked on the film made of the tungsten oxide, followed by annealing. In the method, a reaction, by which a hydrogen atom is released from the tungsten oxide to the atmosphere, can be remarkably enhanced in comparison with the case where there is no film made of the second metal, thereby shortening a time required for the annealing.

It is preferable that the second metal film should be a single film made of at least one kind of metal selected from a group consisting of Pd (palladium), Pt (platinum), Ru (ruthenium) and Ni (nickel), or a film stack or a mixed metal made of two or more kinds of metals selected from the metal group.

The film made of the tungsten oxide may be formed on the substrate except for the first metal film. The film made of the tungsten oxide per se has the property of the semiconductor, that is, a wide-bandgap and has a very high resistivity, and therefore, it can function also as a passivation film for the nitride semiconductor based light-emitting device.

The film made of the tungsten oxide can be readily formed by well-known dry etching with normal fluorocarbon gas such as $CF_4$ in the same manner as with general $SiO_2$, SiN and the like: in contrast, it has a high etching resistance against an acidic aqueous solution incorporating a hydrochloric acid or a fluoric acid or an alkaline solution incorporating ammonium. This is advantageous in constructing processes for manufacturing the nitride semiconductor based light-emitting device.

Furthermore, since the first metal film is subjected to the annealing in a state in which it is protected by the film made of the tungsten oxide in the above-described manufacturing method according to the present invention, the degradation of the first metal film is suppressed on a low level even after the annealing.

The first metal film is made of a material which can be used as a semiconductor contact layer for an ohmic electrode with respect to the P-type nitride semiconductor. This is advantageous in that the first metal film as it is can be used as the semiconductor contact layer for the ohmic electrode by removing only the film made of the tungsten oxide after the annealing.

Moreover, inventors of the present application studied to find that the tungsten oxide film exhibits a relatively favorable ohmic property with respect to the metal film irrespective of the high resistivity, as described above. For example, even in the case where the tungsten oxide film cannot be completely removed in the process of removing the tungsten oxide film but thinly remains, a relatively favorable electric conduction can be achieved with respect to a metal film positioned under the tungsten oxide film by stacking a metal film on the thinly remaining tungsten oxide film.

To the contrary, the tungsten oxide film having a film thickness of about 200 nm and the metal film were stacked directly on the P-type nitride semiconductor, and then, the ohmic property with respect to the P-type nitride semiconductor was evaluated. As a result, it has been confirmed that the ohmic property is not utterly exhibited, and further, that the electric conduction is hardly achieved.

The above-described procedures are included in a manufacturing method of the nitride semiconductor based light-emitting device such as a light-emitting diode (abbreviated as "an LED") or a laser diode (abbreviated as "an LD"), thereby increasing the carrier concentration of the P-type nitride semiconductor in the device, resulting in a reduced contact resistivity of a P-type ohmic electrode.

In the manufacturing method according to the present invention, the hydrogen of the high concentration mixed in the P-type nitride semiconductor can be sufficiently eliminated, so that the concentration of the hydrogen in the P-type nitride semiconductor can be readily reduced more than in the prior art. Thus, the acceptor impurity is excellently activated, thereby achieving the P-type nitride semiconductor having a high carrier concentration and a low resistivity. As a result, the resistivity of the device is reduced.

In addition, it is possible to reduce the contact resistivity of the ohmic electrode against the P-type nitride semiconductor and reduce an operating voltage of the device, thereby providing the nitride semiconductor based light-emitting device having a high performance, in which heat generation is suppressed during operation, and further, providing a semiconductor light emitting apparatus of a high performance having the nitride semiconductor based light-emitting device mounted thereon.

DETAILED DESCRIPTION OF THE PREFERRED EMBODIMENTS

Hereinafter, a description will be given below of preferred embodiments according to the present invention.

A manufacturing method of a nitride semiconductor based light-emitting device according to the present invention refers to procedures performed for obtaining a P-type nitride semiconductor having a high carrier concentration out of all of light-emitting device manufacturing processes. Therefore, only procedures relevant to the manufacturing method according to the present invention will be picked up in some of preferred embodiments described below for the easy explanation by using a crystal substrate of a very simple structure.

First Embodiment

Figure 1:
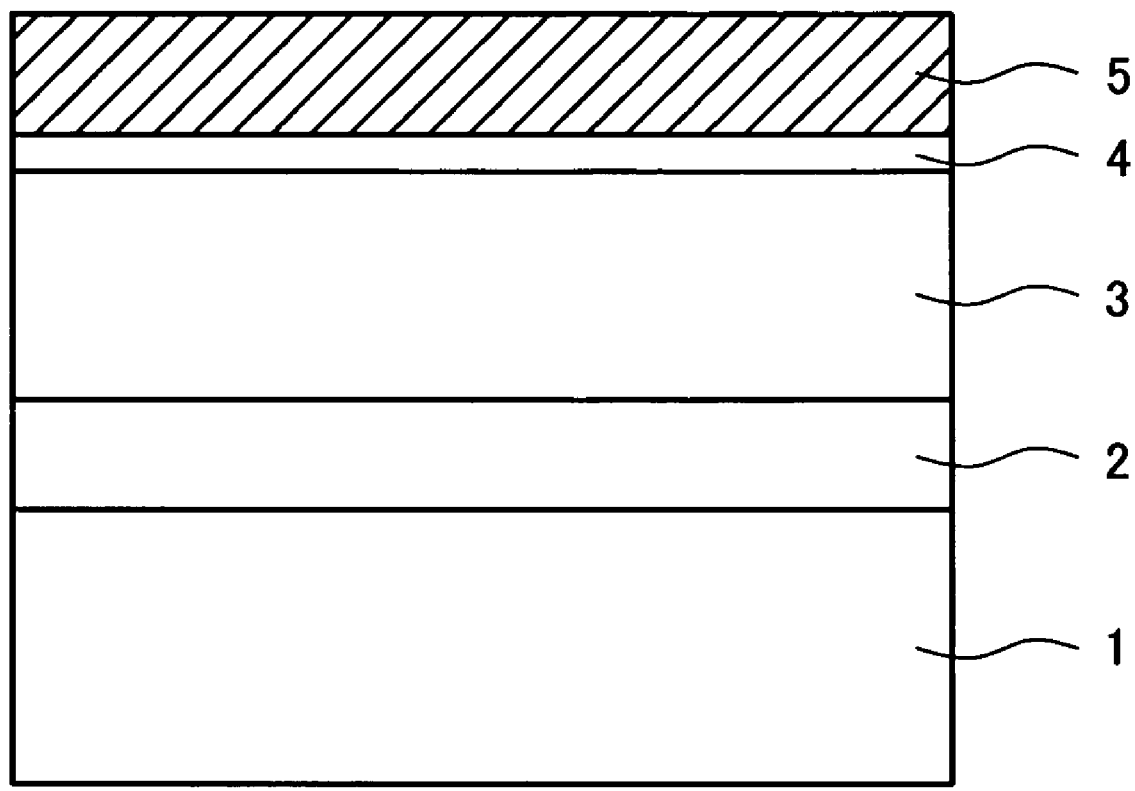
FIG. 1 is a view schematically showing a distinctive structure fabricated in a first embodiment according to the present invention.

FIG. 1 is a view schematically showing a most distinctive structure fabricated in processes of a manufacturing method according to the present invention, the processes being encompassed in the manufacturing method of a nitride semiconductor based light-emitting device. Specifically, FIG. 1 is a cross-sectional view showing a stack structure after a process (B), described below.

In the present preferred embodiment, for the sake of easy comparison between an effect produced by the manufacturing method according to the present invention and an effect produced by the prior art, explanation will be made by using the same substrate as that for use in explicitly describing the problems experienced by the prior art under the section of "Background of the Invention", that is, by using a sapphire substrate having only an Mg doped GaN layer [having an Mg doping concentration (i.e., an SIMS value) of $7.4 \times 10^{19}$ $cm^{-3}$ and a film thickness of 2.0 μm] growing thereon via an AlN buffer layer and an un-doped GaN layer.

Referring to FIG. 1, in a first embodiment:

(A) a P-type nitride semiconductor layer 3 made of the Mg doped GaN layer having the above-described specifications is made to grow on a sapphire substrate 1 via an AlN buffer layer 2 by using well-known MOCVD; and (B) a nickel (Ni) film serving as a first metal layer 4 is deposited on the semiconductor layer 3 in a thickness of 10 nm by using well-known vacuum deposition, and further, a tungsten oxide film 5 is formed in a thickness of 1.0 μm by using CVD;

(C) followed by annealing in the atmosphere at an annealing temperature within a range of 200° C. to 800° C. for 30 minutes.

The concentration of hydrogen incorporated in the P-type nitride semiconductor layer 3 after the process (A) was about $7.5 \times 10^{19}$ $cm^{-3}$, as described above. In contrast, it was revealed that when the concentration of hydrogen incorporated in the semiconductor layer 3 after the process (C) was examined at each of annealing temperatures, the hydrogen concentration starts to decrease at a temperature of 300° C. or higher, and further, that the hydrogen concentration decreases in proportion to the increase in temperature.

The hydrogen concentration after the annealing at a temperature of 300° C. is $5.8 \times 10^{19}$ $cm^{-3}$, which is lower than that after the annealing at a temperature of 500° C. with only Ni film coating in the prior art.

Moreover, when the annealing is increased up to 500° C. or higher, the decrease in hydrogen concentration substantially stops. As a result, it has been found that the annealing at a temperature of 500° C. or higher decreases the hydrogen concentration down to about a half of an initial value (i.e., from $3.6 \times 10^{19}$ $cm^{-3}$ to $3.8 \times 10^{19}$ $cm^{-3}$).

The tungsten oxide film and the Ni film in each of the resultant samples are removed by well-known dry etching and aqua regia soaking, and then, the surface of the P-type nitride semiconductor layer 3 including the Mg doped GaN layer is exposed. Thereafter, a well-known Ni/Au electrode serving as an ohmic electrode is formed on the P-type GaN layer, and then, the carrier concentration of the semiconductor layer 3 is measured by Hall effect measurement.

As a result of evaluation of current-voltage characteristics between the electrodes without any annealing, which has been normally performed after the formation of the electrode, it has been confirmed that only the sample subjected to the annealing at a temperature of 300° C. or higher exhibits a normal ohmic property.

The result of the Hall effect measurement revealed that the carrier concentration at an annealing temperature of 300° C. is $2.2 \times 10^{17}$ $cm^{-3}$.

Furthermore, although the carrier concentration became as high as $6.8 \times 10^{17}$ $cm^{-3}$ to $7.2 \times 10^{17}$ $cm^{-3}$ within a range of the annealing temperature from 500° C. to 700° C., at which the decrease in hydrogen concentration substantially stops, it has been found that the carrier concentration decreases at an annealing temperature of 750° C. or higher in turn.

Furthermore, in the above-described procedures, the first metal film 4 formed on the P-type nitride semiconductor layer 3 including the Mg doped GaN layer is independently made of palladium (Pd), platinum (Pt) and ruthenium (Ru) in a film thickness of 10 nm. Thereafter, the relationship between the annealing temperature and the carrier concentration was examined. The results are plotted in FIG. 2.

Figure 2:
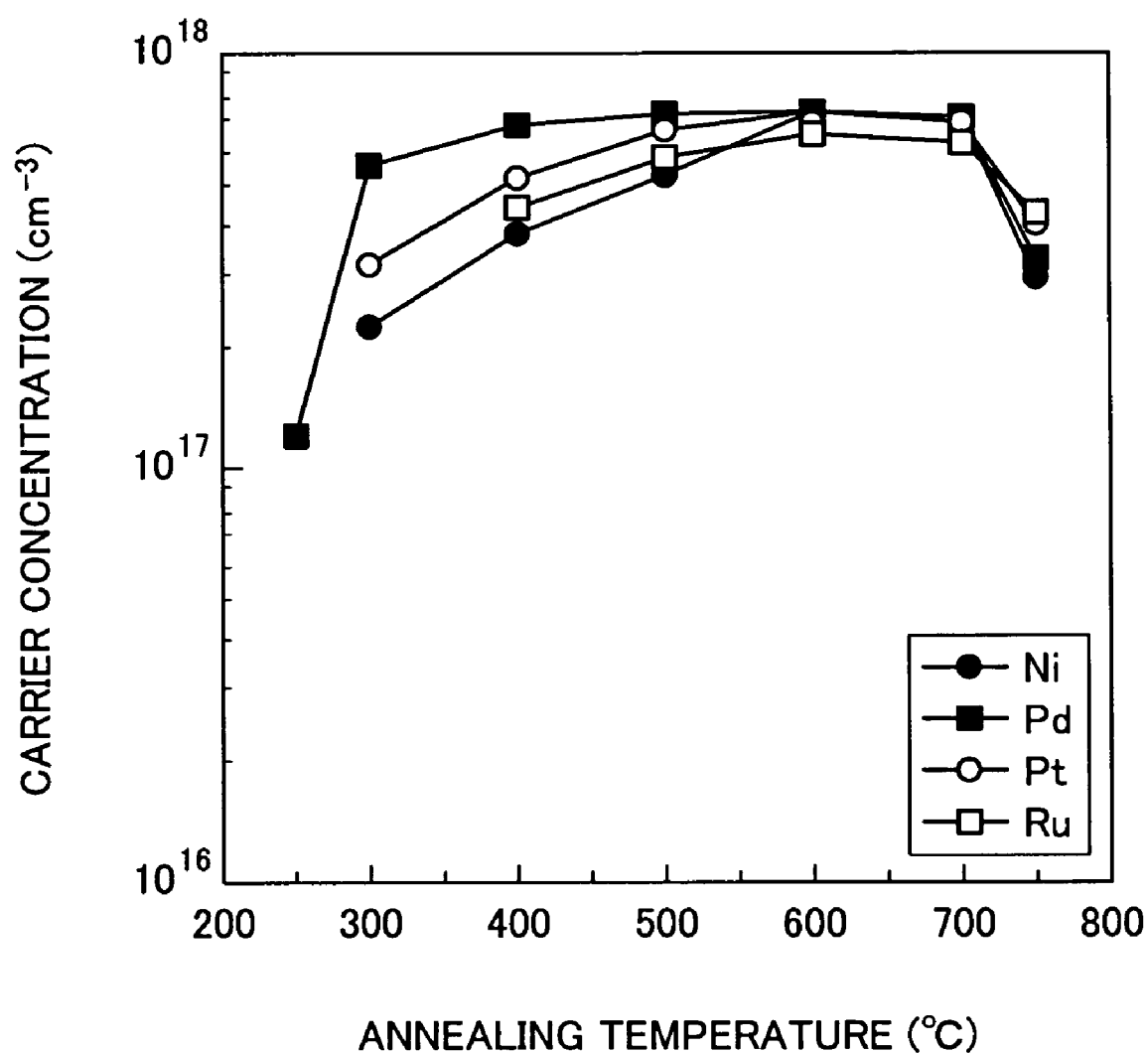
FIG. 2 is a graph illustrating the relationship between an annealing temperature and a carrier concentration of a P-type nitride semiconductor, obtained by the structure fabricated in the first embodiment.

FIG. 2 shows also data on a first metal film made of nickel (Ni).

From FIG. 2, it has been found that the Hall effect measurement can be generally performed at relatively low temperatures from 250° C. to 350° C., although the annealing temperatures, which can be measured by the Hall effect measurement, and the carrier concentrations obtained by the measurement depended upon the kind of metal.

Moreover, from FIG. 2, in the case of the use of the Pd film, the carrier concentration is as low as $1.2 \times 10^{17}$ $cm^{-3}$, although the Hall effect measurement can be performed at a low temperature of 250° C.

However, it has been confirmed that the carrier concentration is increased up to $5.4 \times 10^{17}$ $cm^{-3}$ by the annealing at a temperature of 300° C.

Additionally, it has been confirmed that the measurement can be performed by the annealing at a temperature of 300° C. in the case of the use of the Pd film, like in the case of the use of the Ni film. In the meantime, the measurement can be performed by the annealing at a temperature of 350° C. or higher in the case of the use of the Ru film.

The carrier concentration decreases by the annealing at a temperature higher than 700° C. in all kinds of metals, like in the case of the use of the Ni film. However, it has been found that an absolute value of the carrier concentration depends upon the kind of metal.

As a consequence, the annealing temperature applicable to the manufacturing method according to the present invention should preferably range from 300° C. to 700° C. Furthermore, an optimum temperature should desirably range from 500° C. to 700° C. in the present preferred embodiment.

Second Embodiment

Subsequently, a description will be given of a manufacturing method of a first metal film formed by stacking two kinds of metals out of the above-described four kinds of metals in one preferred embodiment and its effect.

Also in the present preferred embodiment is used the same substrate as that in the first embodiment.

Figure 3:
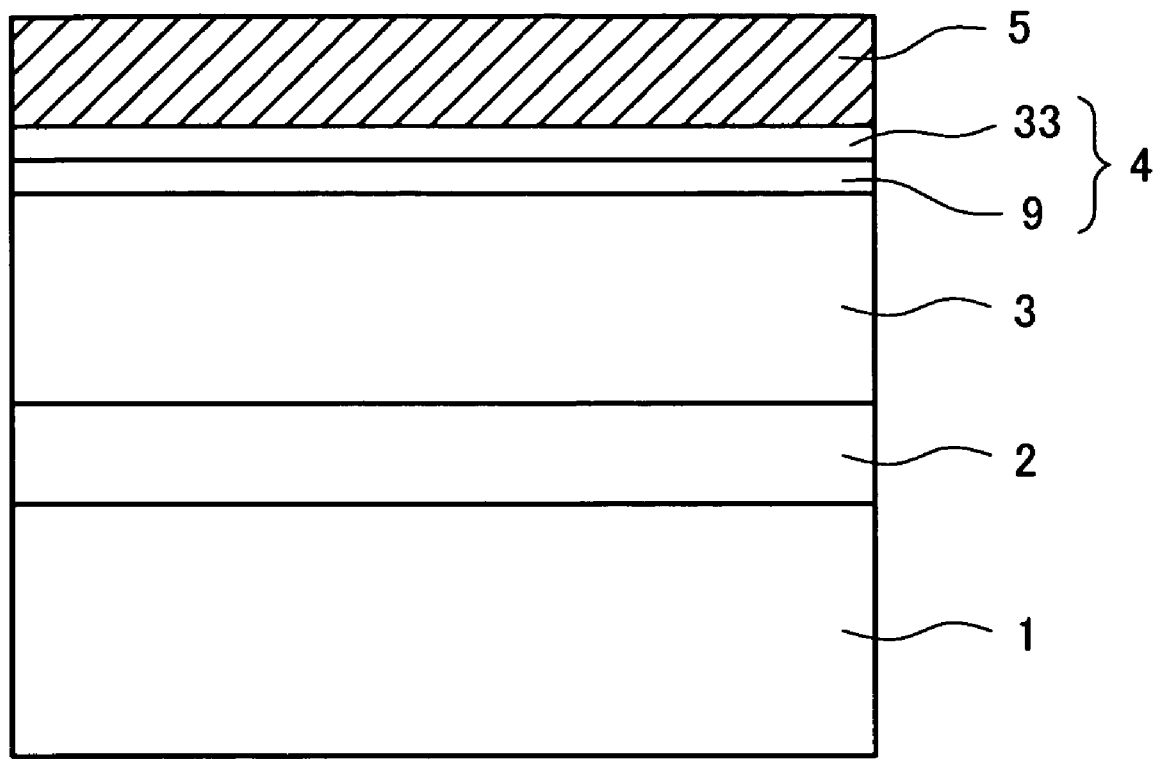
FIG. 3 is a view schematically showing another structure fabricated in a second embodiment according to the present invention.

A first metal film 4 of a dual layer structure consisting of a Pd film 9 having a film thickness of 10 nm as a first layer and a Pt film 33 having a film thickness of 15 nm as a second layer is formed on an Mg doped GaN layer in contact therewith. Thereafter, a tungsten oxide film 5 having a film thickness of 500 nm less than that in the above-described preferred embodiment is formed by sputtering (as shown in FIG. 3). As a result of an annealing experiment in the same manner as the above-described preferred embodiment, it has been found that a hydrogen concentration decreases down to about a half of an initial hydrogen concentration at a timing when an annealing temperature reaches 300° C.

At the same time, it has been found that a carrier concentration becomes $6.5 \times 10^{17}$ cm$^{-3}$ or more within a range of 300° C. to 700° C., and further, it has been confirmed that the annealing temperature can be decreased.

Otherwise, the same tendency as described above was exhibited by forming a Pd film as a lower layer and a film made of another kind of metal as an upper layer, although an absolute value is varied.

Other combinations of multilayers exhibited substantially the same tendency as that in the first embodiment, and therefore, it has been found that the target effect according to the present invention can be sufficiently produced.

Furthermore, the state of the dual layer structure after the annealing was analyzed by the Auger electron spectroscopy. As a result, it has been confirmed that the first and second layers interdiffuse with each other without any initial stacked state.

Consequently, it can be judged that the above-described dual layer structure is the same as a structure of an almost mixed metal formed by the annealing. Therefore, a mode of an optimum first metal film in the second embodiment according to the present invention is not limited to the stack structure. That is to say, the same effect can be produced also in the case of formation of a mixed metal film from the beginning.

Moreover, it is preferable that an optimum annealing temperature in the present preferred embodiment should range from 300° C. to 700° C.

Third Embodiment

Subsequently, a description will be given of a manufacturing method and its effect in the case where an acceptor impurity is very thinly formed between a first metal film and a tungsten oxide film.

Also in the present preferred embodiment is used the same substrate as that in the first embodiment.

A Pd film 9 having a film thickness of 30 nm serving as a first layer formed of a first metal film 4, a Zn film having a film thickness of 3 nm serving as a second layer made of an acceptor impurity material 6 and a tungsten film 34 having a film thickness of 100 nm serving as a third layer are formed on an Mg doped GaN layer in contact therewith by well-known electron beam deposition and resistance heating deposition.

The thickness of the above-described Zn film, that is, 3 nm is a value indicated by a film thickness monitor at the time of coating. The Zn film is actually formed into not a film shape but an island shape.

Figure 4A:
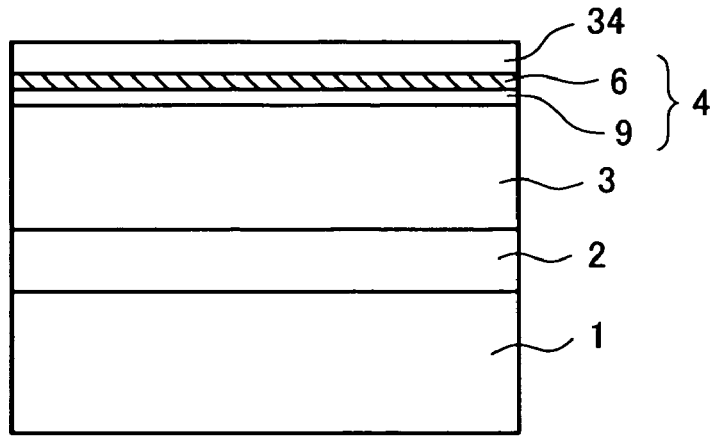
FIGS. 4A and 4B are views schematically showing a further structure fabricated in a third embodiment according to the present invention.
Figure 4B:
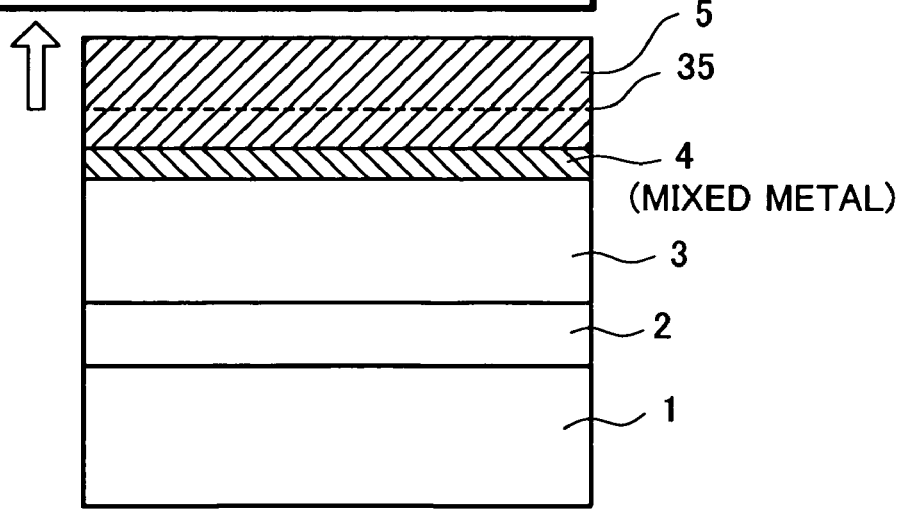

Thereafter, a metal color is decolored from the tungsten film 34 by annealing in the atmosphere at a temperature of 600° C. for one hour, so that the tungsten film 34 becomes transparent (FIGS. 4A and 4B are schematic cross-sectional views before and after the annealing, respectively).

This is because the entire tungsten film 34 is oxidized, to be thus turned into a tungsten oxide film 5.

At this time, it has been confirmed that the thickness of the tungsten oxide film 5 becomes about 300 nm, which is triple an initial thickness. Incidentally, a surface 35 of the tungsten film before the annealing is shown in FIG. 4B.

After the removal of the entire film formed on the Mg doped GaN layer, the behavior of Zn after the annealing was analyzed by the SIMS. As a result, Zn was detected in the vicinity of the surface of the GaN layer, and therefore, it has been confirmed that Zn diffuses at a very shallow area of the Mg doped GaN layer by the annealing.

It has been found that a carrier concentration is $6.9 \times 10^{17}$ cm$^{-3}$ which is a value substantially equal to those in the above-described preferred embodiments, but that current-voltage characteristics between electrodes by Hall effect measurement exhibits a most excellent ohmic property among those in the preferred embodiments described heretofore.

This is attributed to an effect of a remarkable increase in concentration at the outermost surface of the GaN layer owing to the Zn diffused at the surface of the GaN layer.

As a consequence, the manufacturing method according to the present invention can increase the carrier concentration of a P-type nitride semiconductor, which is a target effect produced by the present invention, and remarkably effective in enhancing the ohmic property between the electrode and the semiconductor. Although the acceptor impurity material to be formed on the first metal film has been exemplified by Zn which can be readily coated by the general resistance heating deposition in the present preferred embodiment, an acceptor impurity material may be coated by any method without any limitation.

The acceptor impurity also is not limited to Zn described in the present preferred embodiment. For example, the same Mg as the P-type dopant material incorporated in the nitride semiconductor, C (carbon) and the like may be used. Ideally, Mg having a highest acceptor activation rate in the GaN layer should be particularly preferable.

Additionally, although the description has been given to the use of the Pd film as the first metal film in the first layer in the present preferred embodiment, it is to be understood that other kinds of metals or various combinations thereof should produce the target effect according to the present invention in the same manner as in the first and second embodiments.

Fourth Embodiment

Next, a description will be given of a manufacturing method in a preferred embodiment, in which a second metal film is formed on a tungsten oxide film.

A substrate through the process (B) in the first embodiment is used in the present preferred embodiment.

Figure 5:
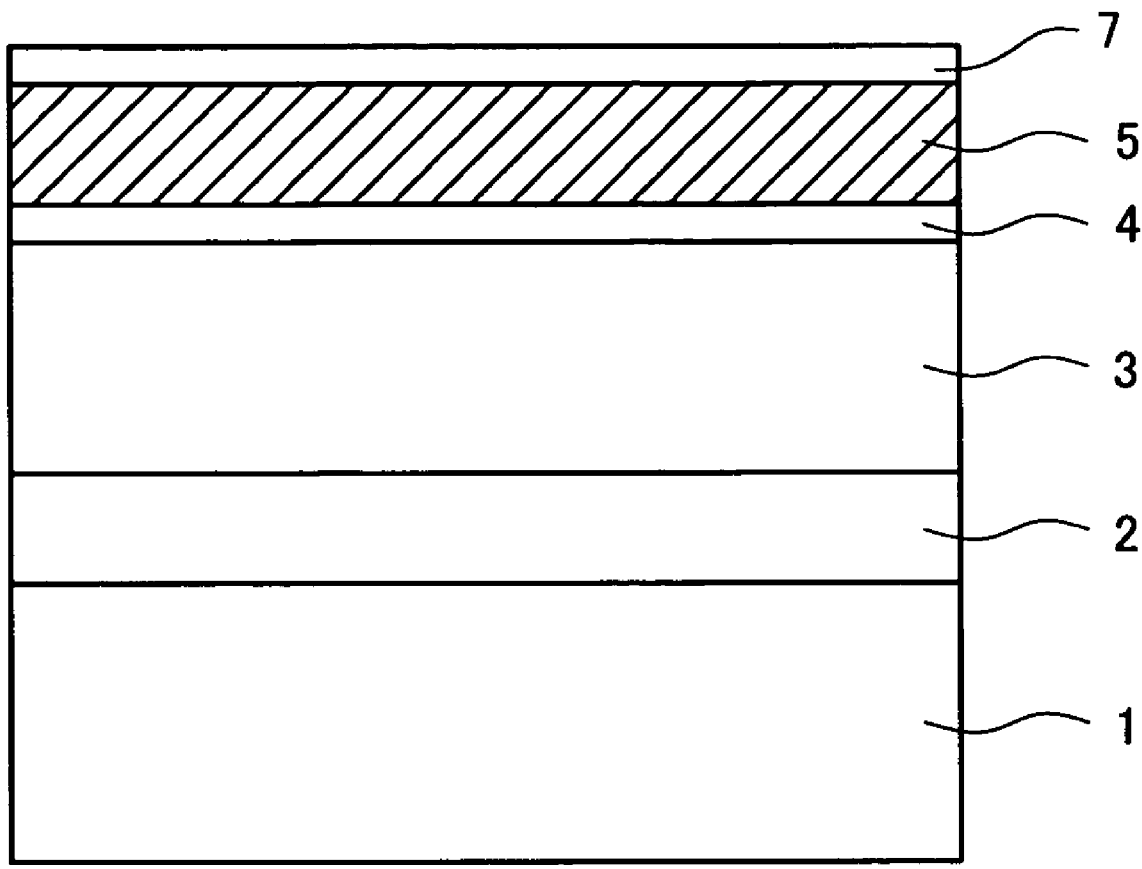
FIG. 5 is a view schematically showing a still further structure fabricated in a fourth embodiment according to the present invention.

A Pd film having a film thickness of 5 nm as a second metal film 7 is formed on a tungsten oxide film 5 by sputtering (as shown in FIG. 5), followed by annealing at a temperature of 400° C. for 2 minutes.

For the sake of comparison, the sample fabricated in the first embodiment also is subjected to annealing in the same manner as described above.

As a result, the carrier concentration of the sample fabricated in accordance with the procedures in the first embodiment was $3.6 \times 10^{17}$ cm$^{-3}$: in contrast, the carrier concentration of a sample fabricated in accordance with procedures in the present preferred embodiment is $5.2 \times 10^{17}$ cm$^{-3}$, which is higher than that of the sample fabricated in accordance with the procedures in the first embodiment.

This is because a reaction when hydrogen is released from the tungsten oxide film to the atmosphere is remarkably promoted by a catalysis of the second metal film. In a method in the present preferred embodiment, it is possible to shorten a time required for the annealing.

Furthermore, although the Pd film has been used as the second metal film in the present preferred embodiment, it is to be understood that a single film made of Ni, Pt or Ru or various combinations thereof should produce a target effect according to the present invention, like in the above-described first to third embodiments.

Fifth Embodiment

Next, a description will be given of a manufacturing method in a preferred embodiment, in which a first metal film after annealing is used as an ohmic electrode for a P-type nitride semiconductor as it is.

The sample fabricated in accordance with the procedures of the processes (A) to (C) in the first embodiment (at an annealing temperature of 600° C.) is used also in the present preferred embodiment.

Only a tungsten oxide film 5 is removed from the sample after the annealing by well-known dry etching, so that an Ni film serving as a first metal film 4 is exposed.

After the removal of a residue adhering by the dry etching by oxygen ashing, the sample is soaked in a fluoric acid solution diluted to about 500 times with pure water for about 10 seconds, followed by cleansing with the pure water for 5 minutes.

At this time, it has been confirmed that the Ni film exposed to the surface is not markedly degraded at all.

Next, a metal plate having openings, each having a size of 10 mm×300 μm, formed at various intervals in parallel to a longitudinal direction of an electrode (i.e., a direction of 10 mm) as electrode patterns is coated with an Ni/Au electrode 8 with masks by well-known electron beam deposition. Here, a film thickness of Ni is 20 nm, and further, a film thickness of Au is 500 nm.

Thereafter, in order to remove the Ni film at an area not coated with any Ni/Au electrode, the entire substrate is etched for one minute by sputter-etching with an Ar$^+$ ion, followed by removing the Ni film.

Although physical damage may be caused in a nitride semiconductor in this method, a film thickness of a nitride semiconductor layer is as great as 2 μm, and further, it is possible to prevent any film peeling from the electrode or the like which was liable to occur by soaking the nitride semiconductor layer in an acidic aqueous solution. Therefore, the sputter-etching is adopted in the present preferred embodiment.

Figure 6:
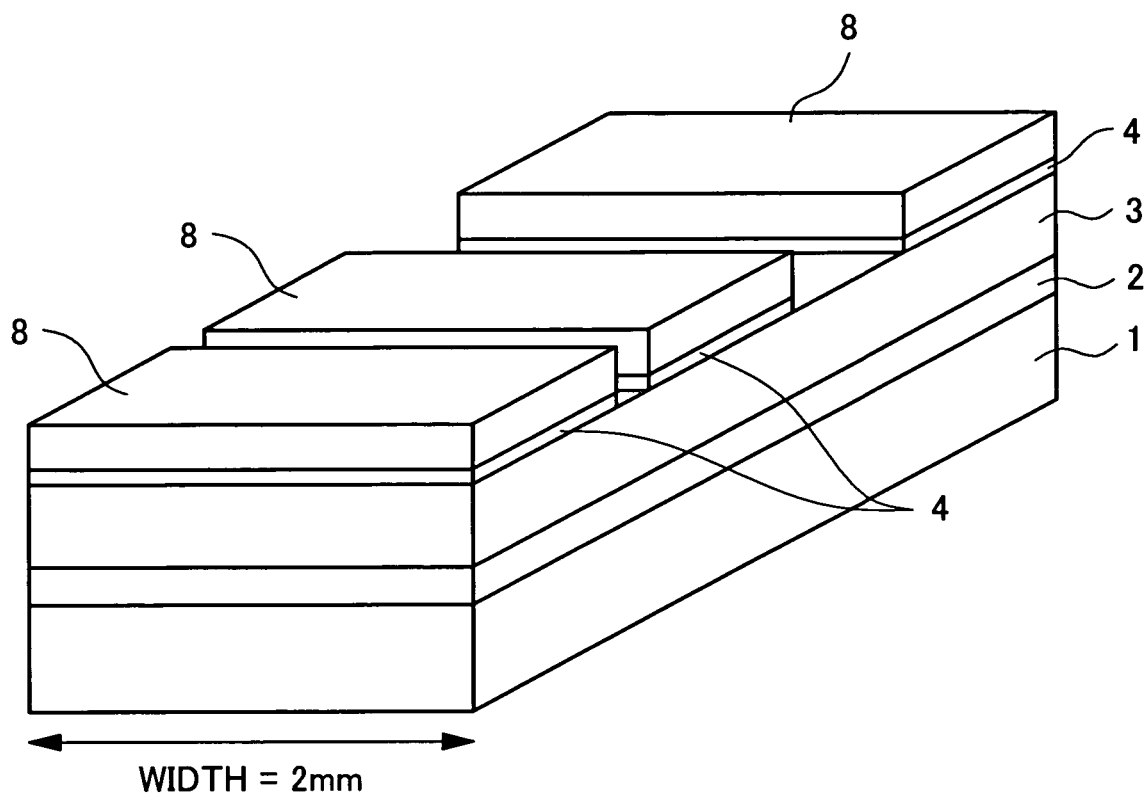
FIG. 6 is a view schematically showing a further structure fabricated in a fifth embodiment according to the present invention.

Finally, the layer is cut out in a width of about 2 mm perpendicularly to the longitudinal direction of the electrode (i.e., the direction of 10 mm), and further, the electrode is subjected to annealing at a temperature of 400° C. for 10 minutes, thereby completing a sample provided with a simple TLM (abbreviating "transmission line model") measurement pattern (as shown in FIG. 6).

With the resultant sample, a contact resistivity pc obtained from a resistivity between the electrodes is 2.6×10$^{-4}$ Ocm$^2$. Thus, it has been confirmed that the value favorably compares with a pc value with respect to the general Mg doped P-type GaN layer reported heretofore.

A TLM measurement sample was fabricated in the same manner as described above also with respect to the sample fabricated in the third embodiment, and then, is evaluated. As a result, it has been found that a contact resistivity pc is 7.4×10$^{-5}$ Ocm$^2$, which is lower than that in the method, in which no acceptor impurity is incorporated.

Consequently, it has been found that the contact resistivity between the electrode formed thereafter and the P-type nitride semiconductor can be effectively reduced in the method described in the third embodiment.

Although the description has been given of the case where the tungsten oxide film 5 is completely removed in the present preferred embodiment, a TLM measurement sample was fabricated and evaluated in the same procedures as described above (wherein the sputter-etching was performed for 5 minutes) while the tungsten oxide film formed on the Ni film serving as the first metal film 4 intentionally remained in a film thickness of about 30 nm. As a result, it has been found that the sample has a contact resistivity pc of 3.8×10$^{-4}$ Ocm$^2$ and characteristics enough to be sufficiently applied to an ohmic electrode for a light-emitting device.

In view of this, it has been confirmed that even the formation of the thin tungsten oxide film between the first metal film and the metals Ni/Au of the electrode cannot influence very much on an ohmic property between the electrode and the semiconductor.

However, since the tungsten oxide film is very high in resistivity, the resistivity inside of the electrode becomes higher as the film becomes thicker, thereby adversely influencing on device characteristics. Therefore, the film thickness is limited to at most about 100 nm.

Furthermore, the method, in which the first metal film is used as the semiconductor contact layer for the ohmic electrode as it is in the present preferred embodiment, is not limited to the above-described combination of the materials. It is to be understood that other various combinations should produce a target effect according to the present invention, like in the above-described first to fourth embodiments.

Moreover, although the description has been given of the above-described preferred embodiment, in which the first metal film is formed in the film thickness from 10 nm to 30 nm, a thinner film having a film thickness of 5 nm or a thicker film having a film thickness of 50 nm can produce the target effect according to the present invention.

However, a phenomenon, in which the hydrogen is occluded in the first metal film by the annealing, becomes prominent in the case of a film thickness of 50 nm or more, and therefore, the first metal film is varied in volume. In other words, since the first metal film per se is repeatedly expanded and contracted, the adhesiveness to the nitride semiconductor is degraded, thereby making the elimination of the hydrogen from the nitride semiconductor difficult, and further, making the fabrication of the ohmic electrode by the method in the fifth embodiment impossible. In view of this, it is desirable that the film thickness of the first metal film should range from 5 nm to 50 nm.

An optimum film thickness should preferably fall within a range of 10 nm to 30 nm.

Although the description has been given of the Mg doped GaN single layer selected as the P-type nitride semiconductor in the above-described preferred embodiment, the Mg doped GaN single layer is merely selected for the sake of easy explanation of the above-described first to fifth embodiments. Therefore, it is not limited to the GaN single layer, in particular.

As a consequence, the present invention is favorably applicable to nitride semiconductor based light-emitting devices at present, which are made of P-type InN, AlN, AlGaN, InGaN and the like. In addition, the effect produced by the present invention can be satisfactorily exhibited in the entire stack structure consisting of a film stack of the Mg doped nitride semiconductor, for example, an Mg doped GaN/an Mg doped AlGaN stack structure.

Additionally, the present invention is applicable also to nitride semiconductors made of other tertiary mixed crystals, or quaternary or quinary mixed crystals, which are more complicated than the above-described materials, in the same manner, although generally not used very much.

The manufacturing method described in the above-described preferred embodiments according to the present invention, that is, the activating method is included in the manufacturing process for allowing an N- and P-type conductive epitaxial stack structure such as the LD or LED to grow on the substrate, and then, actually forming a device by the use of various process techniques, in the manufacturing method of the nitride semiconductor based light-emitting device.

Hereinafter, a description will be given of preferred embodiments, in which a nitride semiconductor based light-emitting device is fabricated by adopting the manufacturing method according to the present invention.

Sixth Embodiment

Figure 7:
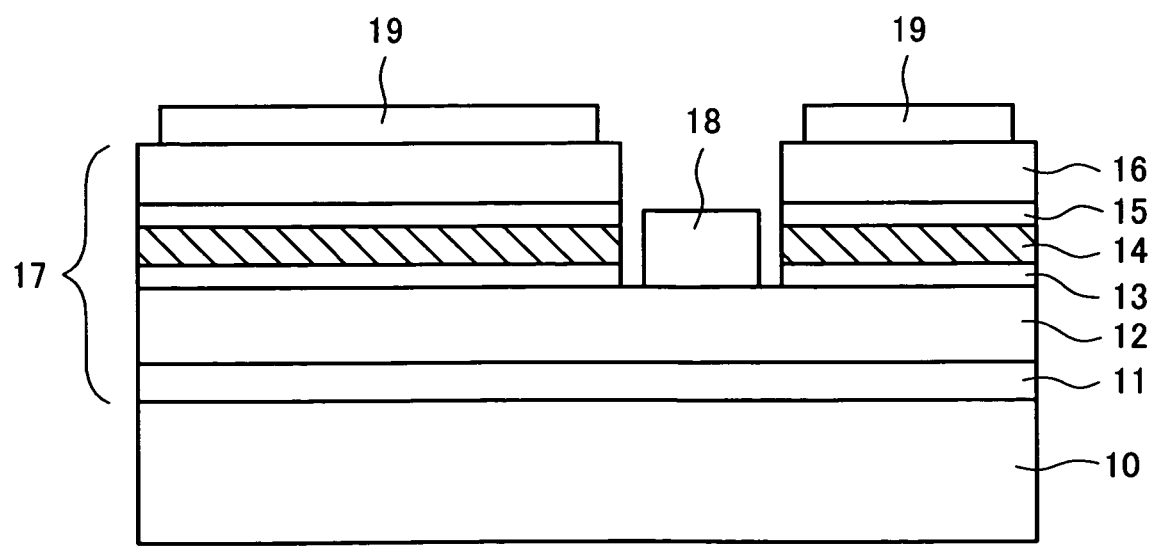
FIG. 7 is a view schematically showing an LED fabricated in a sixth embodiment.

FIG. 7 is a view schematically showing an LED fabricated by using the manufacturing method according to the present invention.

Explanation will be made below on a general manufacturing method.

An LED stack structure 17 is made to grow on a sapphire substrate 10 via a buffer layer 11 made of un-doped GaN. The LED stack structure 17 includes an Si doped N-type GaN layer 12 (having a film thickness of 5 µm and a carrier concentration of $2\times10^{18}$ cm$^{-3}$), an Si doped N-type Al$_{0.08}$Ga$_{0.92}$N clad layer 13 (having a film thickness of 30 nm and a carrier concentration of $1\times10^{18}$ cm$^{-3}$), a light emitting layer 14 of a multiple quantum structure consisting of three un-doped GaN barrier layers (having a film thickness of 20 nm) and two un-doped In$_{0.16}$Ga$_{0.84}$N well layers (having a film thickness of 2.5 nm), an Mg doped P-type Al$_{0.05}$Ga$_{0.95}$N clad layer 15 (having a film thickness of 40 nm and an Mg doping concentration of $7\times10^{19}$ cm$^{-3}$) and an Mg doped P-type GaN semiconductor contact layer 16 (having a film thickness of 100 nm and an Mg doping concentration of $7\times10^{19}$ cm$^{-3}$) by using the general MOCVD.

Subsequently, like the activating method described in the above-described first embodiment according to the present invention, an Ni film having a film thickness of 10 nm serving as the first metal film according to the present invention and a tungsten oxide film having a film thickness of 1000 nm are stacked in sequence at the entire surface, at which the Mg doped P-type GaN semiconductor contact layer 16 is exposed, on the sapphire substrate 10, followed by annealing in the atmosphere at a temperature of 600° C. for 30 minutes. Consequently, hydrogen incorporated in the Mg doped P-type GaN semiconductor contact layer 16 and the Mg doped P-type Al$_{0.05}$Ga$_{0.95}$N clad layer 15 are eliminated, thereby increasing the carrier concentration of each of the semiconductor contact layer 16 and the clad layer 15.

Thereafter, the Ni film and the tungsten oxide film are completely removed.

Next, a desired area is etched at the surface of the stack structure 17 by well-known photolithography and dry etching with chlorine based gas, thereby allowing the Si doped N-type GaN layer 12 to be exposed.

Then, well-known Ti (titanium) and Al (aluminum) films are stacked at the surface of the exposed Si doped N-type GaN layer 12, followed by the annealing at a temperature of 500° C. for 10 minutes, thus forming an N-type ohmic electrode 18 for the Si doped N-type GaN layer 12.

Furthermore, a Pd (palladium) film, a Pt (platinum) film and an Au (gold) film are stacked at a desired area on the Mg doped P-type GaN semiconductor contact layer 16, thus forming a P-type ohmic electrode 19 for the Mg doped P-type GaN semiconductor contact layer 16.

Thereafter, the reverse surface of the sapphire substrate 10 is polished in a thickness of about 150 µm with diamond abrasive grains, and then, the polished surface is finished in such a manner as to become a mirror surface in a final process.

The stack structure 17 is cut in a size of 400 µm by a dicing technique, thereby completing a light-emitting diode (abbreviated as "an LED") serving as a nitride semiconductor based light-emitting device, as shown in FIG. 7.

Thereafter, the electrodes formed at the obverse surface of the LED are turned upside down, and then, each of the electrodes and a submount are bonded to each other, thereby obtaining an LED chip. The LED chip is mounted on a special casing provided with a reflection mirror, to be connected to a lead frame by using an Au wire, thereby completing an LED.

The resultant LED is adapted to utilize, through the sapphire substrate, light to be emitted from the mirror-polished reverse surface. As a result of evaluation of the forward characteristics of the LED such fabricated as described above, a voltage required for achieving a current of 30 mA is as low as 2.4 V, which is affected by the effect according to the present invention.

Additionally, an emission wavelength obtained by measurement is 425 nm, and further, an optical power obtained by a general integrating sphere is 15 mW.

Seventh Embodiment

Figure 8:
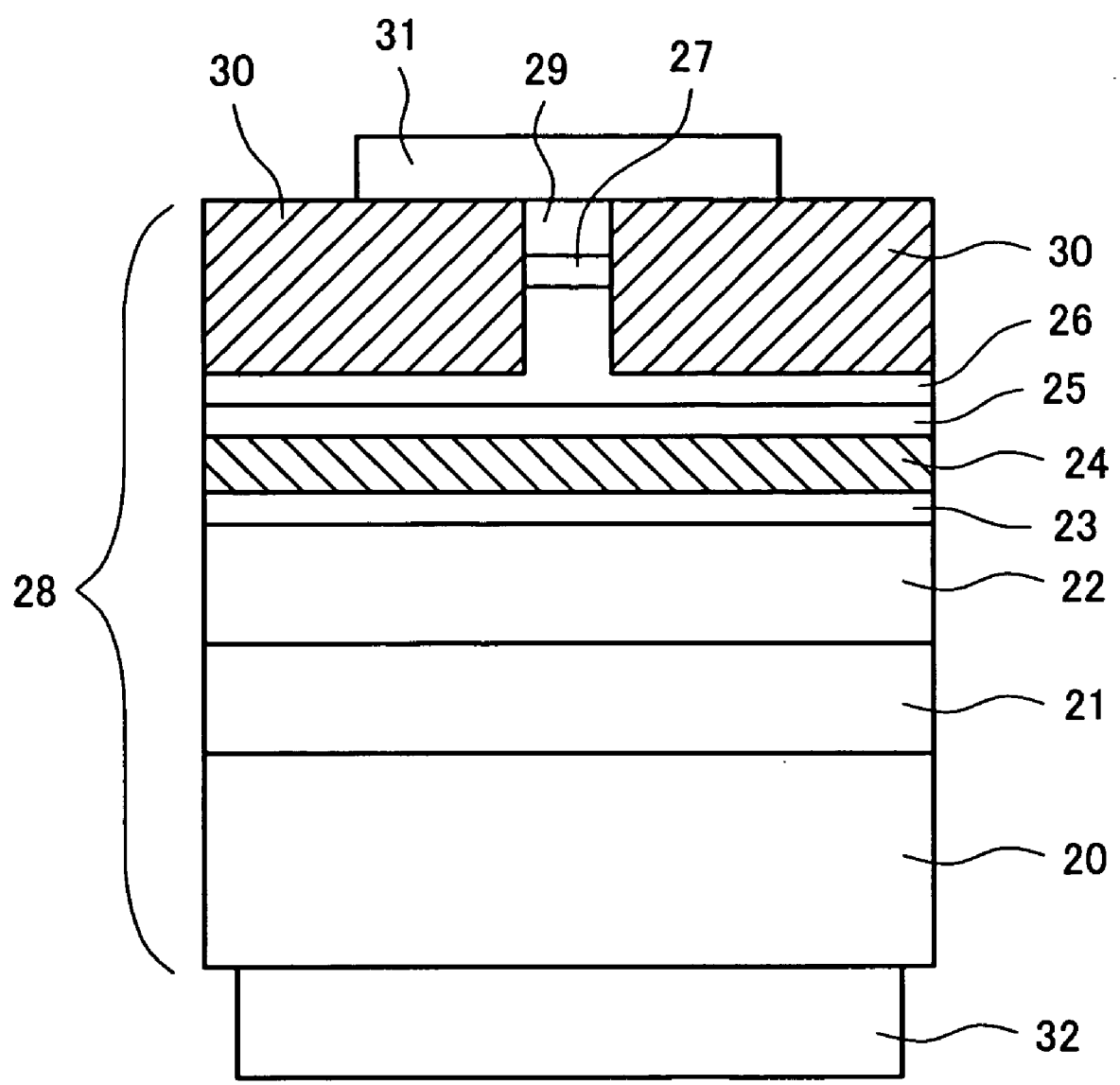
FIG. 8 is a view schematically showing an LD fabricated in a seventh embodiment.

FIG. 8 is a cross-sectional view schematically showing an LD fabricated by using the manufacturing method according to the present invention.

Explanation will be made below on a general manufacturing method.

An LD stack structure 28 is made to grow on an N-type GaN substrate 20. The LD stack structure 28 includes an Si doped N-type GaN buffer layer 21 (having a film thickness of 2 µm and a carrier concentration of $2\times10^{18}$ cm$^{-3}$), an Si doped N-type. Al$_{0.06}$Ga$_{0.94}$N clad layer 22 (having a film thickness of 1.6 µm and a carrier concentration of $1\times10^{18}$ cm$^{-3}$), an Si doped N-type GaN guide layer 23 (having a film thickness of 100 nm and a carrier concentration of $1\times10^{18}$ cm$^{-3}$), a light emitting layer 24 of a multiple quantum structure consisting of four un-doped In$_{0.02}$Ga$_{0.98}$N barrier layers (having a film thickness of 4.7 nm) and three un-doped In$_{0.12}$Ga$_{0.88}$N well layers (having a film thickness of 2.7 nm), an Mg doped P-type Al$_{0.15}$Ga$_{0.85}$N block layer 25 (having a film thickness of 30 nm and an Mg doping concentration of $1\times10^{19}$ cm$^{-3}$), an Mg doped P-type Al$_{0.05}$Ga$_{0.95}$N clad layer 26 (having a film thickness of 500 nm and an Mg doping concentration of $5\times10^{19}$ cm$^{-3}$) and an Mg doped P-type GaN semiconductor contact layer 27 (having a film thickness of 100 nm and an Mg doping concentration of $7\times10^{19}$ cm$^{-3}$) by using the general MOCVD.

Subsequently, a desired area at the surface of the LD stack structure 28 formed on the N-type GaN substrate 20 is etched in about 500 nm to about 550 nm by the well-known photolithography and dry etching with chlorine based gas, so that an LD ridge structure in a resonator width of 1.5 μm having the Mg doped P-type GaN semiconductor contact layer 27 at an uppermost part is formed by exposing the Mg doped P-type $Al_{0.05}Ga_{0.95}N$ clad layer 26.

Next, a first metal film 29 of a triple layer structure consisting of a Pd film having a film thickness of 20 nm, a Pt film having a film thickness of 10 nm and a Zn film having a film thickness of 5 nm according to the present invention is first formed only at the surface of the Mg doped P-type GaN semiconductor contact layer 27 at the uppermost part of the LD ridge by using the combined technique of the activating methods described in the second to fifth embodiments according to the present invention. Then, a tungsten oxide film 30 having a film thickness of 500 nm and an Ru film having a film thickness of 10 nm, not shown, serving as a second metal film are formed at the entire substrate.

Thereafter, the Mg doped P-type GaN semiconductor contact layer 27 and the Mg doped P-type $Al_{0.08}Ga_{0.92}N$ clad layer 26 in the LD ridge are activated by annealing in the atmosphere at a temperature of 600° C. for 10 minutes. With this treatment, the first metal film 29 of the triple layer structure is metal-mixed by interdiffusion.

Subsequently, the Ru film serving as the second metal film is completely removed by sputter-etching, and then, the tungsten oxide film 30 formed at the uppermost part of the LD ridge is removed by using well-known planarizing technique in combination of the photolithography and the dry etching, thereby exposing the metal-mixed first metal film 29, and further, planarizing the entire surface of the substrate.

Next, a metal stack including a Ti (titanium) film and an Au (gold) film is adhesively formed at a desired area including the area at which the first metal film 29 is exposed, thereby forming a P-type ohmic electrode 31, in which the first metal film 29 according to the present invention is used as a semiconductor contact layer with respect to the Mg doped P-type GaN semiconductor contact layer 27.

Thereafter, the reverse surface of the N-type GaN substrate 20 is polished in a total thickness of 100 μm, and then, the polished surface is finished in such a manner as to become a mirror surface in a final process.

A well-known Ti (titanium) film and an Al (aluminum) film are stacked at the reverse surface of the polished N-type GaN substrate 20, followed by annealing at a temperature of 500° C. for 10 minutes, thus forming an N-type ohmic electrode 32.

A bar having numerous laser resonators, each having a ridge structure in a resonator width of 600 μm, arranged thereat is fabricated by cleaving the N-type ohmic electrode 32 in a length of 600 μm perpendicularly to a longitudinal direction of the ridge, and then, insulating coating films having a light reflective function were formed at both edges of the LD resonator.

A laser diode (abbreviated as "an LD") serving as a nitride semiconductor based light-emitting device is completed by cutting the bar in a desired shape in such a manner that the LD resonator is positioned at the center.

Thereafter, the obverse surface of the LD is turned upside down, and then, the P-type ohmic electrode and a special submount are bonded to each other, thereby connecting the N-type ohmic electrode at the reverse surface to a lead frame via an Au wire, so as to complete the LD.

In the LD such fabricated as described above, as a result of examination of a threshold in a laser operation by pulse measurement, a threshold current ranged from 32 mA to 37 mA (/100 devices), and further, a voltage at that time was as low as 2.8 V to 3.1 V with few variations.

As a result of examination of a backward current of the LD device, it has been confirmed that the LD device has a withstand voltage of 30 V or higher. Thus, it has been found that the tungsten oxide film effectively functions as a passivation film for the device. Moreover, it has been confirmed that only four among 100 LD devices went out of order even in a pulsed operation at a laser power of 30 mW for about 5 hours.

Although the description has been given of the case where the tungsten oxide film was used as the passivation film as it was in accordance with procedures in the manufacturing method in the above-described preferred embodiments, it is to be understood that the tungsten oxide film should be removed, and then, a film coated with normal $SiO_2$, SiN, $Al_2O_3$ and the like should be used as the passivation film.

In addition, although the description has been given of the above-described preferred embodiments in which the present invention was applied to the manufacturing method of the LD of a ridge waveguide type having the ridge structure, the present invention may be applied to a manufacturing method of an LD of a vertical cavity surface emitting type, which emits a laser beam from the obverse or reverse surface of the substrate.

Although the description has been given of the above-described sixth and seventh embodiments which are relevant to the light-emitting device and a light emitting apparatus fabricated by taking the basic elements in the manufacturing method in the first to fifth embodiments, the items such as the metal material to be used, the film thickness, the annealing temperature and the period of time are not limited to the examples described in the above-described sixth and seventh embodiments. Any combination may be used as long as the items fall within the ranges described in the first to fifth embodiments.

As described above, the nitride semiconductor based device having a low device resistivity, a low operating voltage and a high light emitting efficiency can be provided by using the manufacturing method of the nitride semiconductor based apparatus according to the present invention.

Incidentally, reference numerals indicated in the attached drawings of the present application designate, as follows:

1 . . . sapphire substrate, 2 . . . AlN buffer layer, 3 . . . P-type nitride semiconductor layer made of Mg doped GaN layer, 4 . . . first metal layer, 5 . . . tungsten oxide film, 6 . . . acceptor impurity material, 7 . . . second metal layer, 8 . . . Ni/Au electrode, 9 . . . Pd film, 10 . . . sapphire substrate, 11 . . . buffer layer made of un-doped GaN, 12 . . . Si doped N-type GaN layer, 13 . . . Si doped N-type $Al_{0.08}Ga_{0.92}N$ clad layer, 14 . . . light emitting layer, 15 . . . Mg doped P-type $Al_{0.05}Ga_{0.95}N$ clad layer, 16 . . . Mg doped P-type GaN semiconductor contact layer, 17 . . . LED stack structure, 18 . . . N-type ohmic electrode, 19 . . . P-type ohmic electrode, 20 . . . N-type GaN substrate, 21 . . . Si doped N-type GaN buffer layer, 22 . . . Si doped N-type $Al_{0.06}Ga_{0.94}N$ clad layer, 23 . . . Si doped N-type GaN guide layer, 24 . . . light emitting layer, 25 . . . Mg doped P-type $Al_{0.15}Ga_{0.85}N$ block layer, 26 . . . Mg doped P-type $Al_{0.05}Ga_{0.95}N$ clad layer, 27 . . . Mg doped P-type GaN semiconductor contact layer, 28 . . . LD stack structure, 29 . . . first metal layer, 30 . . . tungsten oxide film, 31 . . . P-type ohmic electrode, 32 . . . N-type ohmic electrode, 33 . . . Pt film, 34 . . . tungsten film, 35 . . . surface of tungsten film before annealing.

What is claimed is:

1. A method of manufacturing a nitride semiconductor based light-emitting device comprising:
    an epitaxial multilayer formation process for stacking an N-type conductive nitride semiconductor layer, an active layer made of a semiconductor and a P-type conductive nitride semiconductor layer in this order on a semiconductor wafer;
    a metal film formation process for forming a first metal film on the P-type conductive nitride semiconductor layer;
    a film formation process for forming a film made of tungsten oxide on the first metal film;
    an annealing process for subjecting the semiconductor wafer after the film formation process to annealing;
    a film removing process for removing the film made of the tungsten oxide; and
    an electrode formation process for forming an electrode capable of achieving an ohmic contact with each of the N- and P-type conductive nitride semiconductor layers.

2. A method of manufacturing a nitride semiconductor based light-emitting device as claimed in claim 1, wherein the first metal film is a single film made of at least one kind of metal selected from a group consisting of Pd (palladium), Pt (platinum), Ru (ruthenium) and Ni (nickel), or a film stack or a mixed metal made of two or more kinds of metals selected from the metal group.

3. A method of manufacturing a nitride semiconductor based light-emitting device as claimed in claim 1, wherein the first metal film incorporates therein a material serving as an acceptor impurity for a nitride semiconductor.

4. A method of manufacturing a nitride semiconductor based light-emitting device as claimed in claim 1, further comprising:
    a process for forming, on the first metal film, a film incorporating therein a material serving as an acceptor impurity for a nitride semiconductor after the metal film formation process and before the formation process for forming the film made of the tungsten oxide.

5. A method of manufacturing a nitride semiconductor based light-emitting device as claimed in claim 2, wherein the first metal film incorporates therein a material serving as an acceptor impurity for a nitride semiconductor.

6. A method of manufacturing of a nitride semiconductor based light-emitting device as claimed in claim 2, further comprising:
    a process for forming, on the first metal film, a film incorporating therein a material serving as an acceptor impurity for a nitride semiconductor after the metal film formation process and before the film formation process.

7. A method of manufacturing a nitride semiconductor based light-emitting device as claimed in claim 1, wherein the film made of the tungsten oxide deposited on a device area, at which the multilayer is formed in a convexity above the wafer by etching, is removed in the film removing process, while a part of the film made of the tungsten oxide deposited on an area other than the device area is adapted to remain thereon in the removal step.

8. A method of manufacturing a nitride semiconductor based light-emitting device as claimed in claim 1, wherein the film made of the tungsten oxide is formed by sputtering.

9. A method of manufacturing of a nitride semiconductor based light-emitting device as claimed in claim 1, wherein the film made of the tungsten oxide is formed by CVD (chemical vapor deposition).

10. A method of manufacturing a nitride semiconductor based light-emitting device as claimed in claim 1, wherein the film made of the tungsten oxide is formed by the annealing in the atmosphere including oxygen therein after a tungsten thin film is formed.

11. A method of manufacturing a nitride semiconductor based light-emitting device as claimed in claim 1, further comprising:
    a process for forming a second metal film on the film made of the tungsten oxide after the film formation process and before the annealing process.

12. A method of manufacturing a nitride semiconductor based light-emitting device as claimed in claim 11, wherein the second metal film is a single film made of at least one kind of metal selected from a group consisting of Pd (palladium), Pt (platinum), Ru (ruthenium) and Ni (nickel), or a film stack or a mixed metal made of two or more kinds of metals selected from the metal group.

13. A manufacturing method of a nitride semiconductor based light-emitting device as claimed in claim 11, wherein the film made of the tungsten oxide is formed by the annealing in the atmosphere including oxygen therein after a tungsten thin film is formed.

14. A nitride semiconductor based light-emitting device comprising:
    a multilayer having an N-type conductive nitride semiconductor, an active layer and a P-type conductive nitride semiconductor stacked in sequence on a semiconductor wafer, the multilayer having an etched side wall; and
    a film made of tungsten oxide embedded in such a manner as to surround the side wall.

15. A nitride semiconductor based light-emitting device as claimed in claim 14, wherein the nitride semiconductor based light-emitting device is a light-emitting diode (an LED).

16. A nitride semiconductor based light-emitting device as claimed in claim 15, wherein the nitride semiconductor based light-emitting device is a laser diode (an LD).

* * * * *